US011223765B2

(12) United States Patent
Smyth et al.

(10) Patent No.: US 11,223,765 B2
(45) Date of Patent: Jan. 11, 2022

(54) DYNAMIC FLEX CIRCUIT FOR CAMERA WITH MOVEABLE IMAGE SENSOR

(71) Applicant: Apple Inc., Cupertino, CA (US)

(72) Inventors: Nicholas D. Smyth, San Jose, CA (US); Jian Ouyang, San Jose, CA (US); Scott W. Miller, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/025,957

(22) Filed: Sep. 18, 2020

(65) Prior Publication Data

US 2021/0092297 A1    Mar. 25, 2021

Related U.S. Application Data

(60) Provisional application No. 62/906,038, filed on Sep. 25, 2019.

(51) Int. Cl.
*H04N 5/232*    (2006.01)
*H04N 5/225*    (2006.01)

(52) U.S. Cl.
CPC ....... *H04N 5/23287* (2013.01); *H04N 5/2253* (2013.01); *H04N 5/23212* (2013.01)

(58) Field of Classification Search
CPC ............. H04N 5/23287; H04N 5/2253; H04N 5/23212
See application file for complete search history.

(56) References Cited

U.S. PATENT DOCUMENTS

| 5,862,014 | A | 1/1999 | Nute |
| 7,679,647 | B2 | 3/2010 | Stavely et al. |
| 2009/0213236 | A1* | 8/2009 | Chiou ................ H04N 5/23287 348/208.11 |
| 2015/0321900 | A1 | 11/2015 | Liu et al. |
| 2015/0350500 | A1* | 12/2015 | Gutierrez ............... H05K 1/182 348/374 |
| 2017/0227785 | A1* | 8/2017 | Chan ..................... H04N 5/2254 |
| 2018/0259787 | A1 | 9/2018 | Kim et al. |
| 2019/0141248 | A1* | 5/2019 | Hubert ............... H04N 5/23287 |
| 2019/0235202 | A1* | 8/2019 | Smyth .................. G02B 27/646 |

FOREIGN PATENT DOCUMENTS

| WO | 2017/15642 | 9/2017 |
| WO | 2019/018364 | 1/2019 |

OTHER PUBLICATIONS

International Search Report and Written Opinion from PCT/US2020/051773, dated Dec. 22, 2020, pp. 1-13.

* cited by examiner

*Primary Examiner* — Padma Haliyur
(74) *Attorney, Agent, or Firm* — Robert C. Kowert; Kowert, Hood, Munyon, Rankin & Goetzel, P.C.

(57) ABSTRACT

Various embodiments include a dynamic flex circuit that may be used in a camera with a moveable image sensor. The dynamic flex circuit may include one or more fixed end portions, a moveable end portion, and an intermediate portion. In some embodiments, the fixed end portion may be connected to another flex circuit of the camera. The moveable end portion may be coupled with the moveable image sensor. The intermediate portion may be configured to allow the moveable end portion to move with the moveable image sensor. Some embodiments include a reinforcement arrangement that reinforces one or more portions of the dynamic flex circuit.

20 Claims, 7 Drawing Sheets

DYNAMIC FLEX CIRCUIT FOR CAMERA WITH MOVEABLE IMAGE SENSOR

This application claims benefit of priority to U.S. Provisional Application No. 62/906,038, filed Sep. 25, 2019, titled "Dynamic Flex Circuit for Camera With Moveable Image Sensor", which is hereby incorporated by reference in its entirety.

BACKGROUND

Technical Field

This disclosure relates generally to a dynamic flex circuit for a camera with a moveable image sensor.

Description of the Related Art

The advent of small, mobile multipurpose devices such as smartphones and tablet or pad devices has resulted in a need for high-resolution, small form factor cameras for integration in the devices. Some cameras may incorporate optical image stabilization (OIS) mechanisms that may sense and react to external excitation/disturbance by adjusting location of the optical lens on the X and/or Y axis in an attempt to compensate for unwanted motion of the lens. Furthermore, some cameras may incorporate an autofocus (AF) mechanism whereby the object focal distance can be adjusted to focus an object plane in front of the camera at an image plane to be captured by the image sensor. In some such AF mechanisms, the optical lens is moved as a single rigid body along the optical axis of the camera to refocus the camera.

BRIEF DESCRIPTION OF THE DRAWINGS

FIG. 3 shows the dynamic flex circuit in an example flat state. FIG. 4 shows the dynamic flex circuit in an example folded state.

Figure 1:
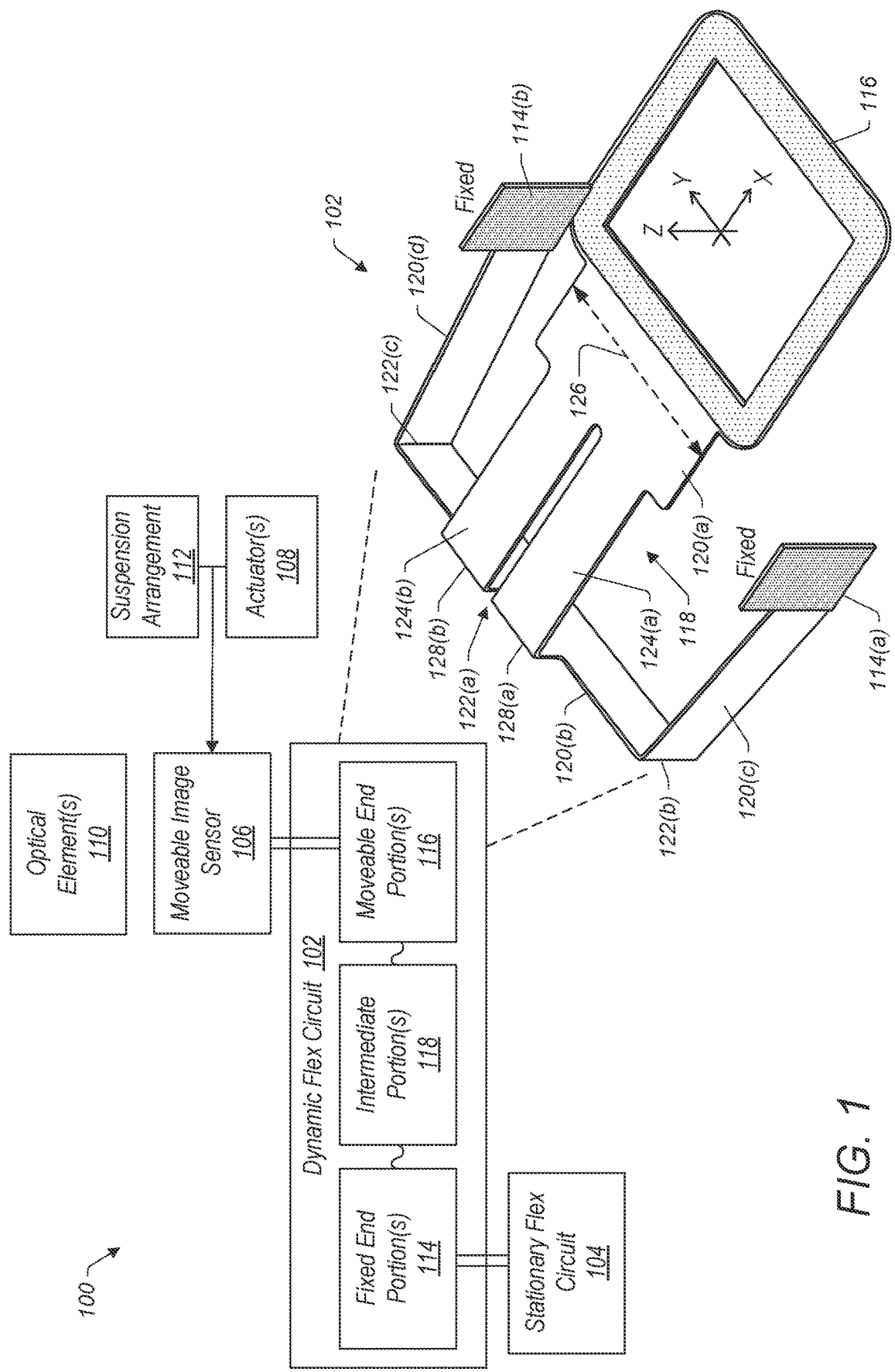
FIG. 1 illustrates a schematic block diagram of some components of an example camera with a moveable image sensor, and a perspective view of an example dynamic flex circuit that may be used with the moveable image sensor, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments described herein relate to a flex circuit (also referred to herein as a "dynamic flex circuit") that may be used in a camera with a moveable image sensor. In some examples, the camera may include the dynamic flex circuit, a stationary flex circuit, a moveable image sensor, an actuator, and/or one or more optical elements. The image sensor may be configured to capture light that has passed through the optical element(s). The actuator may be configured to move the image sensor relative to the optical element(s), e.g., so as to provide autofocus (AF) and/or optical image stabilization (OIS) functionality. Additionally, or alternatively, the actuator may be configured to move one or more of the optical element(s) relative to the image sensor, e.g., so as to provide AF and/or OIS functionality. In some non-limiting examples, the actuator may be configured to move the image sensor orthogonal to a plane defined by the image sensor. Additionally, or alternatively, the actuator may be configured to move the image sensor parallel to the plane defined by the image sensor.

In various embodiments, the dynamic flex circuit may include one or more fixed end portions, a moveable end portion, and an intermediate portion. The fixed end portions may be connected to the stationary flex circuit. The moveable end portion may be coupled with the image sensor such that the moveable end portion moves with (e.g., in lockstep with) the image sensor. The intermediate portion may extend from each of the fixed end portions to the moveable end portion. The intermediate portion may be configured to allow the moveable end portion to move (e.g., with the image sensor) relative to the fixed end portions. In some embodiments, the dynamic flex circuit may be configured to convey electrical signals (e.g., power and/or control signals) along at least a portion of an electrical connection path between the stationary flex circuit and the moveable image sensor. As will be discussed herein with reference to FIGS. 1-6, the intermediate portion of the dynamic flex circuit may include one or more straight regions and one or more bend regions.

In some embodiments, the dynamic flex circuit may be subjected to high strain and/or cyclic loading conditions. As discussed herein with reference to FIGS. 5-6, a reinforcement arrangement may be used to reduce stress and strain at the bend region(s). Additionally, or alternatively, one or more of the straight regions of the dynamic flex circuit may be designed with sufficient service loop to reduce stress and strain at the bend region(s). Additionally, or alternatively, the bend radii of the bend regions may be designed to reduce stress and strain at the bend regions.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

As mentioned above, various embodiments include a dynamic flex circuit for a camera with a moveable image sensor. FIG. 1 shows a schematic block diagram of some components a camera 100 including an example of such a dynamic flex circuit 102. Furthermore, FIG. 1 shows a perspective view of the dynamic flex circuit 102. The example X-Y-Z coordinate system shown in FIG. 1 is used to discuss aspects of components and/or systems, and may apply to embodiments described throughout this disclosure.

According to various embodiments, the camera 100 may include the dynamic flex circuit 102, a stationary flex circuit 104 (e.g., a flex circuit of a module of the camera 100), a moveable image sensor 106, one or more actuators 108, one or more optical elements 110, and/or a suspension arrangement 112. The image sensor 106 may be configured to capture light that has passed through the optical element(s) 110. The actuator(s) 108 may be configured to move the image sensor 106 relative to the optical element(s) 110, e.g., to provide AF and/or OIS functionality. Additionally, or alternatively, the actuator(s) 108 may be configured to move one or more of the optical element(s) 110 relative to the image sensor 106, e.g., to provide AF and/or OIS functionality. In some non-limiting examples, the actuator(s) 108 may be configured to move the image sensor 106 orthogonal to a plane defined by the image sensor 106 (e.g., movement in the Z-axis direction). Additionally, or alternatively, the actuator(s) 108 may be configured to move the image sensor 106 parallel to the plane defined by the image sensor 106 (e.g., movement in the X-Y plane directions).

In various embodiments, the dynamic flex circuit 102 may include one or more fixed end portions 114, one or more moveable end portions 116, and/or one or more intermediate portions 118. As indicated in the perspective view of the dynamic flex circuit 102 in FIG. 1, in some non-limiting examples the dynamic flex circuit 102 may include fixed end portions 114(a) and 114(b), a moveable end portion 116, and an intermediate portion 118. The fixed end portions 114(a) and 114(b) may be connected to the stationary flex circuit 104. The moveable end portion 116 may be coupled with the image sensor 106 such that the moveable end portion 116 moves with (e.g., in lockstep with) the image sensor 106. The intermediate portion 118 may extend from each of the fixed end portions 114(a) and 114(b) to the moveable end portion 116. The intermediate portion 118 may be configured to allow the moveable end portion 116 to move (e.g., with the image sensor 106) relative to the fixed end portions 114(a) and 114(b). In some embodiments, the dynamic flex circuit 102 may be configured to convey electrical signals (e.g., power and/or control signals) along at least a portion of an electrical connection path between the stationary flex circuit 104 and the moveable image sensor 106.

In some embodiments, the fixed end portions 114(a) and 114(b) of the dynamic flex circuit 102 may be fixedly attached to the stationary flex circuit 104 (which may be considered a stationary structure) and/or fixedly attached to another stationary structure (e.g., stationary structure 208 in FIG. 2) of the camera 100. For example, the fixed end portions 114(a) and 114(b) may be attached to one or more stationary structures, and an electrical connection may be provided between the fixed end portions 114(a) and 114(b) and the stationary flex circuit 104 via the stationary structure(s). In some embodiments, each of the fixed end portions 114(a) and 114(b) may have a first side that is attached to the stationary flex circuit 104 and a second side (e.g., opposite the first side) that is attached to another stationary structure.

According to some embodiments, fixed end portion 114(a) and/or fixed end portion 114(b) of the dynamic flex circuit 102 may comprise a respective electrical connection pad (e.g., an exposed copper pad) that may be electrically connected (e.g., via hot-bar soldering) to a corresponding electrical connection component of the stationary flex circuit 104. In some embodiments, fixed end portion 114(a) and/or fixed end portion 114(b) may define a respective plane that is orthogonal to a respective plane defined by the moveable end portion 116 and/or the image sensor 106, e.g., as indicated in FIG. 1. However, it is contemplated that, in some embodiments, fixed end portion 114(a) and/or fixed end portion 114(b) may define a respective plane that is oriented differently (e.g., parallel to) relative to a respective plane defined by the moveable end portion 116 and/or the image sensor 106.

In various embodiments, the moveable end portion 116 of the dynamic flex circuit 102 may be coupled with the image sensor 106. For example, the image sensor 106 may be attached to (or otherwise coupled with) a substrate (e.g., substrate 206 in FIG. 2) of the camera 100, and the moveable end portion 116 may be attached to the substrate. In some embodiments, the moveable end portion 116 may be electrically connected to the image sensor 106 via the substrate and/or one or more other intervening components.

According to various embodiments, the intermediate portion 118 of the dynamic flex circuit 102 may extend from the moveable end portion 116 to each of the fixed end portions 114(a) and 114(b). The intermediate portion 118 may include one or more straight regions and/or one or more bend regions. As indicated in FIG. 1, in some non-limiting examples, the intermediate portion 118 may include a first straight region 120(a), a second straight region 120(b), a third straight region 120(c), and/or a fourth straight region 120(d). Furthermore, the intermediate portion 118 may include a first bend region 122(a), a second bend region 122(b), and/or a third bend region 122(c). The first bend region 122(a) may interconnect the first straight region 120(a) with the second straight region 120(b). The second bend region 122(b) may interconnect the second straight region 120(b) with the third straight region 120(c). The third bend region 122(c) may interconnect the second straight region 120(b) with the fourth straight region 120(c). According to some examples, a pair of adjacent straight regions (e.g., the first straight region 120(a) and the second straight region 120(b)) may be positioned at a respective non-zero bend angle (e.g., 90 degrees) with respect to each other so as to comprise a bend via a bend region (e.g., the first bend region 122(a)). In various embodiments, the bend angle may change slightly as the image sensor 106 is moved, but the bend may be present through the entire potential range of motion of the image sensor 106. In some non-limiting examples, the bend angle may be within a range of 45 degrees to 135 degrees. In some other non-limiting examples, the bend angle may be within a range of 60 degrees and 120 degrees.

In some embodiments, the first straight region 120(a) may define a plane that is parallel to the X-Y plane, and may have a longest dimension extending in the X-axis direction from the moveable end portion 116 to the first bend region 122(a). The second straight region 120(b) may define a plane that is parallel to the Y-Z plane, and may have a longest dimension extending in the Y-axis direction from the second bend region 122(b) to the third bend region 122(c). The third straight region 120(c) may define a plane that is parallel to the X-Z plane, and may have a longest dimension extending in the X-axis direction from the second bend region 122(b) to fixed end portion 114(a). The fourth straight region 120(d) may define a plane that is parallel to the X-Z plane, and may have a longest dimension extending in the X-axis direction from the third bend region 122(c) to fixed end portion 114(b). As indicated in FIG. 1, the dynamic flex circuit 102 may be symmetrical (e.g., about a plane that is parallel to the X-Z plane). However, the dynamic flex circuit 102 may be asymmetrical about one or more planes that are parallel to the X-Z plane, the Y-Z plane, and/or X-Z plane.

According to some embodiments, the longest dimension of the first straight region 120(a) may be sized so as to reduce stiffness of the dynamic flex circuit 102 in the Z-axis direction, e.g., to allow movement of the moveable end portion 116 in the Z-axis direction. The longest dimension of the second straight region 120(b) may be sized so as to reduce stiffness of the dynamic flex circuit 102 in the X-axis direction, e.g., to allow movement of the moveable end portion 116 in the X-axis direction. The longest dimension of the third straight region 120(c) may be sized so as to reduce stiffness of the dynamic flex circuit 102 in the Y-axis direction, e.g., to allow movement of the moveable end portion 116 in the Y-axis direction. Similarly, the longest dimension of the fourth straight region 120(d) may be sized so as to reduce stiffness of the dynamic flex circuit 102 in the Y-axis direction, e.g., to allow movement of the moveable end portion 116 in the Y-axis direction.

In some embodiments, the first bend region 122(a) may be a region at which the dynamic flex circuit 102 bends about a first axis. The second bend region 122(b) may be a region at which the dynamic flex circuit 102 bends about a second axis. The third bend region 122(c) may be a region at which the dynamic flex circuit 102 bends about a third axis. In some embodiments, one or more of the axes may intersect one or more of the other axes. In some non-limiting examples, the first axis (corresponding to the first bend region 122(a)) may intersect the second axis (corresponding to the second bend region 122(b)) and/or the third axis (corresponding to the third bend region 122(c)). In some non-limiting examples, the first axis may be orthogonal to each of the second axis and the third axis. Furthermore, in some embodiments, one or more of the axes may be parallel to one or more of the other axes. In some non-limiting examples, the second axis may be parallel to the third axis. According to some non-limiting examples, the first axis may be parallel to the Y-axis (and/or parallel to a respective plane defined by the moveable end portion 116 and/or the image sensor 106), the second axis may be parallel to the Z-axis (and/or orthogonal to the respective plane defined by the moveable end portion 116 and/or the image sensor 106), and/or the third axis may be parallel to the Z-axis (and/or orthogonal to the respective plane defined by the moveable end portion 116 and/or the image sensor 106).

In some embodiments, one or more of the straight regions and/or the bend regions of the dynamic flex circuit 102 may split, at least in part, into multiple "legs." As a non-limiting example, a portion of the first straight region 120(*a*) may split into two legs 124(*a*) and 124(*b*) that extend in parallel from a wider portion 126 of the first straight region 120(*a*) to the first bend region 122(*a*), e.g., as indicated in FIG. 1. In some examples, the first bend region 122(*a*) may split into two corresponding legs 128(*a*) and 128(*b*) that connect with legs 124(*a*) and 124(*b*), respectively. In some embodiments, the wider portion 126 of the first straight region 120(*a*) may provide a fan-out space for electrical signal traces (not shown) routed from the moveable end portion 116 to fixed end portion 114(*a*) and/or fixed end portion 114(*b*). For example, one or more electrical signal traces may be routed along the following path: from the moveable end portion 116 to the wider portion 126 of the first straight region 120(*a*), from the wider portion 126 to leg 124(*a*) of the first straight region 120(*a*), from leg 124(*a*) to corresponding leg 128(*a*) of the first bend region 122(*a*), from corresponding leg 128(*a*) to second straight region 120(*b*) in a first direction to the second bend region 122(*b*) (e.g., through a segment of the second straight region 120(*b*) that extends from its connection to the first bend region 122(*a*) to its connection to the second bend region 122(*b*)), from the second bend region 122(*b*) to fixed end portion 114(*a*). Additionally, or alternatively, one or more electrical signal traces may be routed along the following path: from the moveable end portion 116 to the wider portion 126 of the first straight region 120(*a*), from the wider portion 126 to leg 124(*b*) of the first straight region 120(*a*), from leg 124(*b*) to corresponding leg 128(*b*) of the first bend region 122(*a*), from corresponding leg 128(*b*) to second straight region 120(*b*) in a second direction (e.g., opposite the first direction) to the third bend region 122(*c*) (e.g., through another segment of the second straight region 120(*b*) that extends from its connection to the first bend region 122(*a*) to its connection to the third bend region 122(*c*)), and from the third bend region 122(*c*) to fixed end portion 114(*b*).

In some embodiments, the number, type(s), size(s), and/or arrangement of electrical signal traces that are routed via leg 124(*a*) may be the same as, or may differ from, those routed via leg 124(*b*). In various non-limiting examples, electrical signal traces and/or dummy traces (e.g., elements that do not actually convey electrical signals) may be distributed between the legs 124(*a*) and 124(*b*) such that symmetry of weight is maintained, e.g., about a plane defining symmetry of geometry of the dynamic flex circuit 102.

According to some embodiments, a portion of the wider portion 126 may be used to provide a surface area for attachment of the moveable end portion 116 to one or more components (e.g., to the substrate via an adhesive), e.g., to couple the dynamic flex circuit 102 with the image sensor 106. Additionally, or alternatively, the moveable end portion 116 may provide surface area for the same (or similar) attachment. In some non-limiting examples, the moveable end portion 116 may loop around a periphery edge portion of the substrate and/or another component that is coupled with the image sensor 106.

As discussed above, the camera 100 may include actuator(s) 108 and/or a suspension arrangement 112. In some non-limiting examples, the actuator(s) may comprise a voice coil motor (VCM) actuator. The VCM actuator may include one or more magnets and one or more coils. The magnet(s) and coil(s) may magnetically interact to produce Lorentz forces that move the image sensor 106, e.g., to provide AF and/or OIS functionality. However, the actuator(s) 108 may include any other actuator suitable for moving the image sensor 106. In various embodiments, the suspension arrangement 112 may be configured to suspend the image sensor 106 from one or more stationary structures (e.g., base structure 210 in FIG. 2). Furthermore, the suspension arrangement 112 may be configured to allow movement of the image sensor 106, e.g., in accordance with movement caused by the actuator(s) 108. In some non-limiting examples, the suspension arrangement 112 may include one or more flexures (e.g., leaf spring(s), suspension wire(s), flexure arm(s), etc.) and/or bearings (e.g., ball bearings), etc.

According to some embodiments, the optical element(s) 110 may include a lens group. For example, the lens group may include one or more lens elements that define an optical axis. In some embodiments, the optical element(s) 100 may additionally, or alternatively, include one or more light-folding elements (e.g., a prism, a mirror, etc.) configured to fold a path of light before the light reaches the image sensor 106. As such, the camera 100 may be considered to have a folded optics arrangement that folds a path of light one or more instances before reaching the image sensor 106. In some embodiments, a folded optics arrangement may provide spaces at certain locations that enable space-efficient inclusion of the dynamic flex circuit 102. As a non-limiting example, at least part of the intermediate portion 118 may be disposed within a space below a light-folding element and/or below a lens group without increasing the Z-axis dimension of the camera 100. In some embodiments, the camera 100 may not include light-folding elements.

As discussed above, in some examples, the actuator(s) 108 may be configured to move one or more of the optical element(s) 110 relative to the image sensor 106. Furthermore, the actuator(s) 108 may be configured to move the image sensor 106 relative to the optical element(s) 110. In a non-limiting example, the optical element(s) 110 may include a lens group and one or more light-folding elements. The actuator(s) 108 may be configured to move the lens group and/or the light-folding element(s) relative to the image sensor 106, e.g., so as to provide AF functionality. Furthermore, the actuator(s) 108 may be configured to move the image sensor 106 relative to the optical element(s) 110, e.g., so as to provide OIS functionality. According to some non-limiting examples, the number of bend regions and/or straight regions of the dynamic flex circuit 102 may be reduced in embodiments where the number of movement axes of the image sensor 106 is reduced, e.g., by having the actuator(s) 108 move one or more of the optical element(s) 110 relative to the image sensor 106 for AF and/or OIS in addition to having the actuator(s) 108 move the image sensor 106 for AF and/or OIS.

Figure 2:
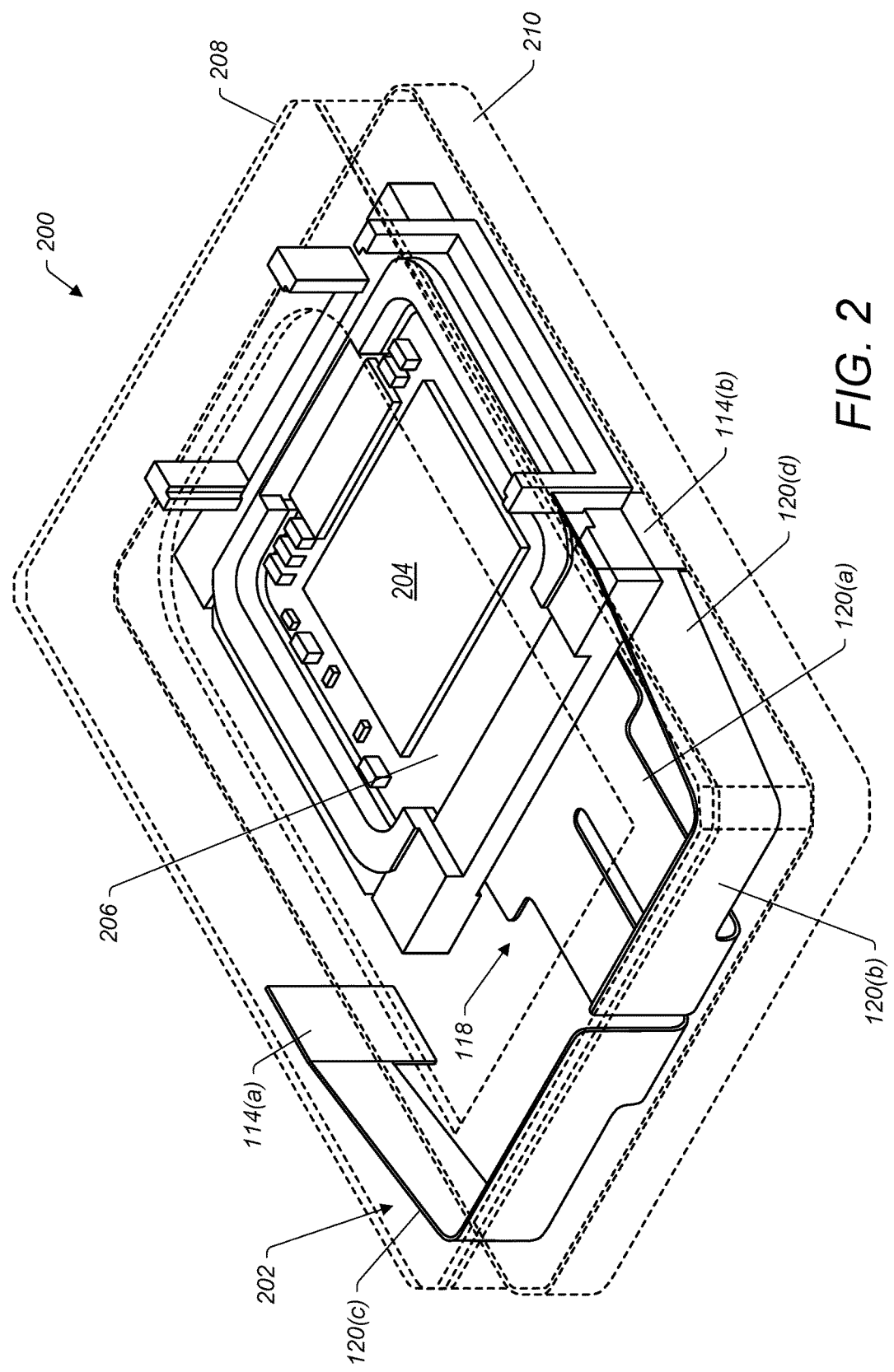
FIG. 2 illustrates a perspective view of portions of an example camera that includes a dynamic flex circuit that may be used with a moveable image sensor, in accordance with some embodiments.

FIG. 2 illustrates a perspective view of portions of an example camera 200 that includes a dynamic flex circuit 202 that may be used with a moveable image sensor 204. In some embodiments, aspects of the camera 200 may be the same as (or similar to) aspects of the camera 100 described herein with reference to FIG. 1. In some embodiments, aspects of the dynamic flex circuit 202 may be the same as (or similar to) aspects of one or more of the dynamic flex circuits described herein with reference to FIGS. 1 and 3-6. For simplicity of discussion, the terms used to describe portions of the dynamic flex circuit 100 of FIG. 1 will be used herein to reference portions of the dynamic flex circuit 200 of FIG. 2.

According to some embodiments, the camera 200 may include the dynamic flex circuit 202, an image sensor 204, a substrate 206, and one or more stationary structures (e.g., stationary structure 208, base structure 210, etc.). The image sensor 204 may be attached to the substrate 206 and/or one or more other components, such as a moveable platform of a suspension arrangement of the camera 200.

In some embodiments, the dynamic flex circuit 202 may include the fixed end portions 114(a) and 114(b), the intermediate portion 118, and the moveable end portion 116 (obstructed from the reader's view by other components in FIG. 2). The fixed end portions 114(a) and 114(b) may be attached to the stationary structure 208. In some embodiments, the stationary structure 208 may comprise the stationary flex circuit 104 described herein with reference to FIG. 1. Additionally, or alternatively, the stationary structure 208 may provide an electrical connection between the stationary flex circuit 104 and each of the fixed end portions 114(a) and 114(b) of the dynamic flex circuit 202. In some embodiments, the moveable end portion 116 may be attached to the substrate 206 and/or otherwise coupled with the image sensor 204. As a non-limiting example, the moveable end portion 116 may be attached to a first side of the substrate 206, and the image sensor 204 may be attached to a second side (e.g., opposite the first side) of the substrate 206.

According to some embodiments, one or more portions of the dynamic flex circuit 202 may extend along (and/or proximate to) one or more respective sides of the camera 200, e.g., for the efficient use of space. For example, as indicated in FIG. 2, the moveable end portion 116 and the first straight portion 120(a) may extend along a first side (e.g., an upper or lower side) of the camera 200, the second straight portion 120(b) may extend along a second side of the camera 200, the third straight portion 120(c) may extend along a third side of the camera 200, and the fourth straight portion 120(d) may extend along a fourth side (e.g., opposite the third side) of the camera 200. The first side may be orthogonal to the second side, the third side, and/or the fourth side.

Figure 3:
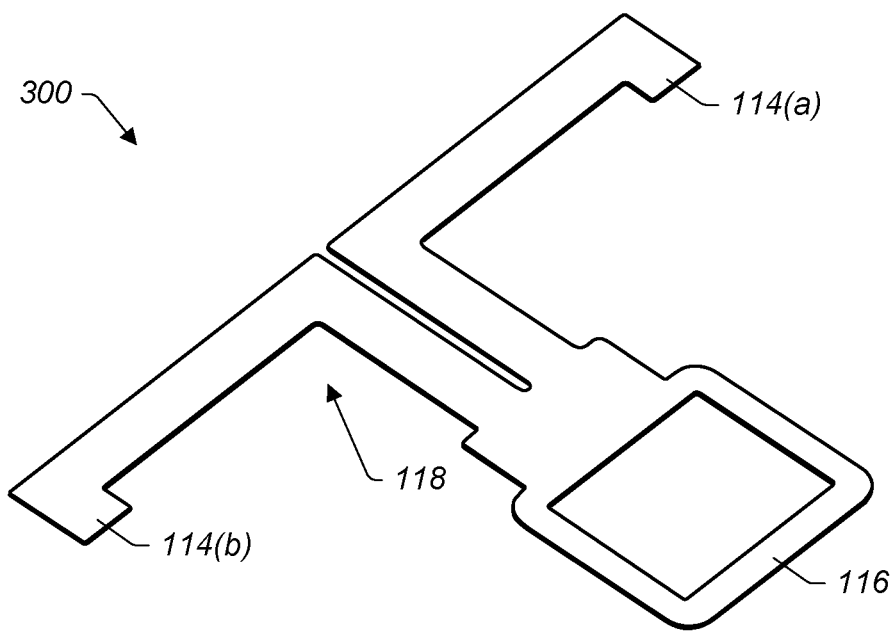
FIGS. 3-4 illustrate perspective views of an example dynamic flex circuit for a camera with a moveable image sensor, in accordance with some embodiments.
Figure 4:
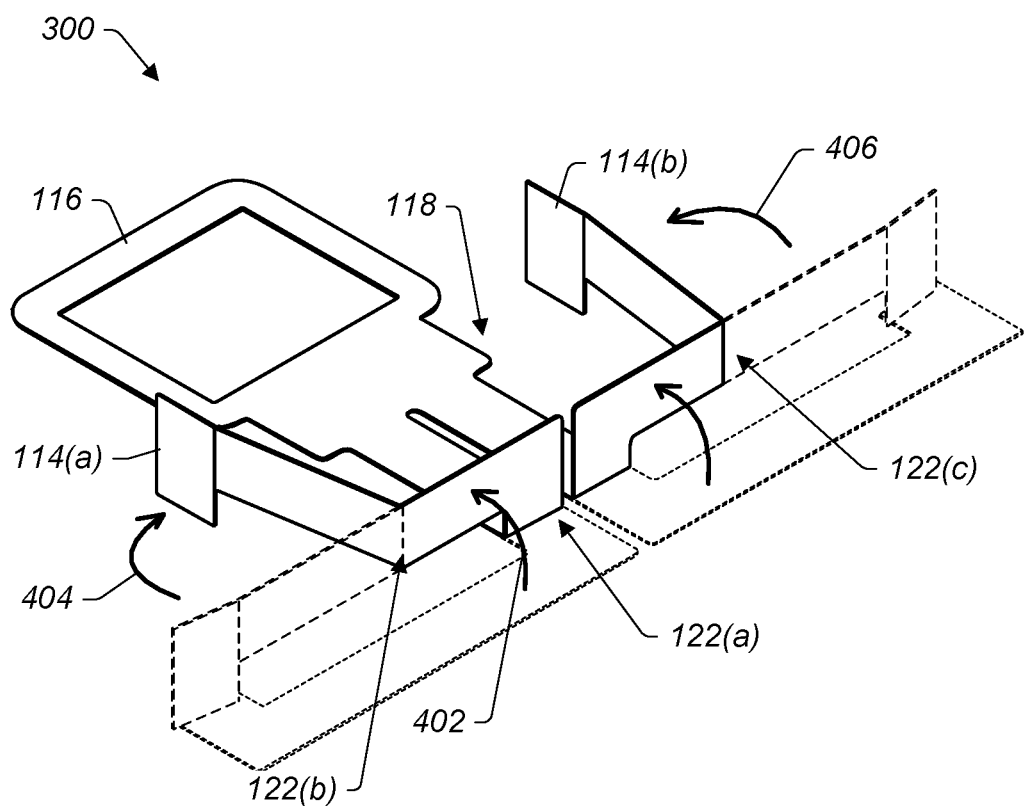

FIGS. 3-4 illustrate perspective views of an example dynamic flex circuit 300 for a camera with a moveable image sensor. FIG. 3 illustrates an example of the dynamic flex circuit 300 in a flat state. FIG. 4 illustrates an example of folding the dynamic flex circuit 300 into a folded state. In some embodiments, aspects of the dynamic flex circuit 300 may be the same as (or similar to) aspects of one or more of the dynamic flex circuits described herein with reference to FIGS. 1-2 and 5-6. For simplicity of discussion, the terms used to describe portions of the dynamic flex circuit 100 of FIG. 1 will be used herein to reference portions of the dynamic flex circuit 300 of FIGS. 3-4.

In some embodiments, the dynamic flex circuit 300 may be formed to a particular flat pattern (e.g., the flat pattern shown in FIG. 3) that is suitable for folding into the folded state shown in FIG. 4. In some non-limiting embodiments, the dynamic flex circuit 300 may formed by etching or otherwise cutting flex circuit material(s) into the particular flat pattern.

In some non-limiting embodiments, the dynamic flex circuit 300 may be transformed from the flat state to a folded state by folding the dynamic flex circuit 300 one or more times, e.g., as indicated in FIG. 4. In some embodiments, the dynamic flex circuit 300 may be folded at the first bend region 122(a), e.g., as indicated by arrows 402. Additionally, or alternatively, the dynamic flex circuit 300 may be folded at the second bend region 122(b), e.g., as indicated by arrow 404. Additionally, or alternatively, the dynamic flex circuit 300 may be folded at the third bend region 122(c), e.g., as indicated by arrow 406. It should be understood, however, that the dynamic flex circuit 300 may be folded at fewer or more locations, by varying degrees, and/or in different orientations than indicated in FIG. 4. Furthermore, the order of folding the dynamic flex circuit 300 may be different in various embodiments.

Figure 5:
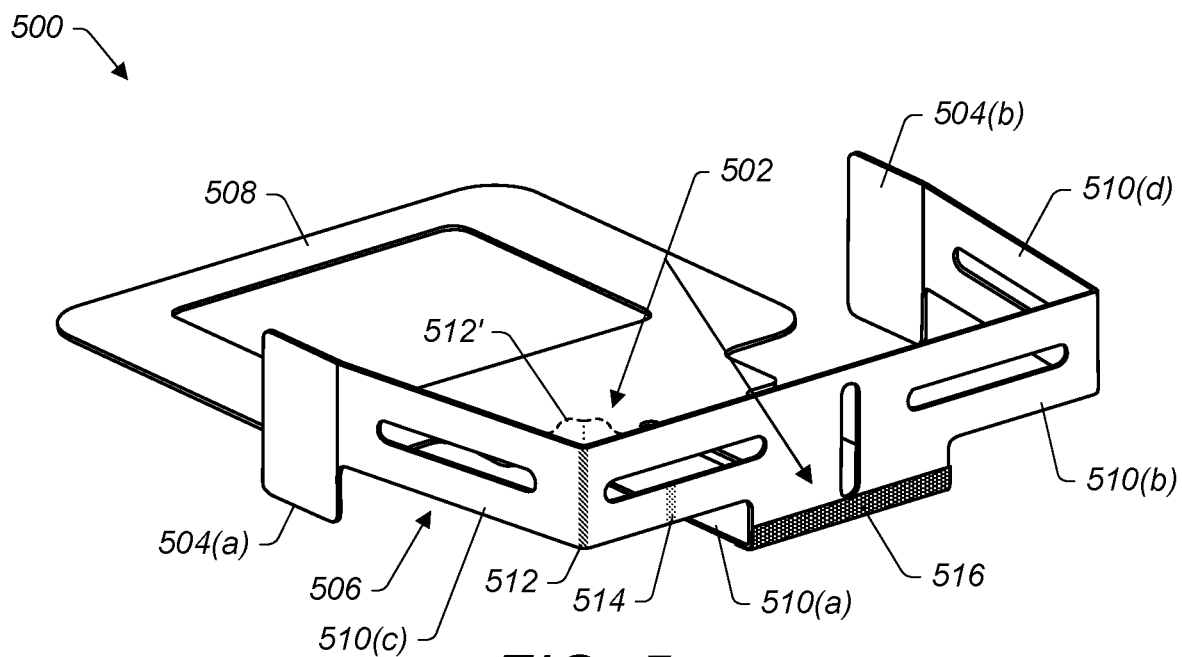
FIG. 5 illustrates an example reinforcement arrangement for reinforcing one or more portions of a dynamic flex circuit in a camera with a moveable image sensor, in accordance with some embodiments.

FIG. 5 illustrates an example reinforcement arrangement for reinforcing one or more portions of a dynamic flex circuit 500 in a camera with a moveable image sensor. In some embodiments, aspects of the dynamic flex circuit 500 may be the same as (or similar to) aspects of one or more of the dynamic flex circuits described herein with reference to FIGS. 1-4 and 6. According to various embodiments, the reinforcement arrangement 502 may include one or more bend regions of the dynamic flex circuit 500 that are locally widened relative to one or more adjacent straight regions of the dynamic flex circuit 500. Additionally, or alternatively, the reinforcement arrangement 502 may include one or more additional layers of material attached to the dynamic flex circuit 500 at one or more bend regions. In some embodiments, the dynamic flex circuit 500 may be subjected to high strain and/or cyclic loading conditions, and the reinforcement arrangement 502 may reduce stress and strain at the bend region(s). According to some embodiments, at least a portion of the reinforcement arrangement 502 (e.g., comprising one or more additional layers of material attached to the dynamic flex circuit 500 at one or more bend regions may additionally, or alternatively, be used for retaining a bend shape of the dynamic flex circuit 500 at the bend region(s).

In some embodiments, the dynamic flex circuit 500 may include fixed end portions 504(a) and 504(b), intermediate portion 506, and moveable end portion 508. The intermediate portion 506 may include a first straight region 510(a), a second straight region 510(b), a third straight region 510(c), and a fourth straight region 510(d). As indicated in FIG. 5, one or more of the straight regions 510(a)-(d) may be split, at least in part, into multiple legs, e.g., by forming one or more slots in the straight region(s).

According to various embodiments, the dynamic flex circuit 500 may comprise one or more flex circuit materials. As a non-limiting example, the dynamic flex circuit 500 may comprise composite layers of polyimide (PI), adhesive, and copper. In some embodiments, the reinforcement arrangement 502 may include a contiguous strip of at least one of the flex circuit materials that is wider at a bend region than respective contiguous strips of the flex circuit material(s) at one or more adjacent straight regions. For example, FIG. 5 indicates that a locally widened contiguous strip 512 that is wider than a contiguous strip 514 at an adjacent straight region. In some embodiments, the locally widened contiguous strip 512 may be formed by splitting the adjacent straight region(s) into multiple legs, e.g., as indicated in FIG. 5. Additionally, or alternatively, the locally widened contiguous strip 512 may be formed by including one or more protruding portions 512' (e.g., protruding above and/or below the bend region) that increase the width at the bend region relative to the adjacent straight region(s).

Figure 6:
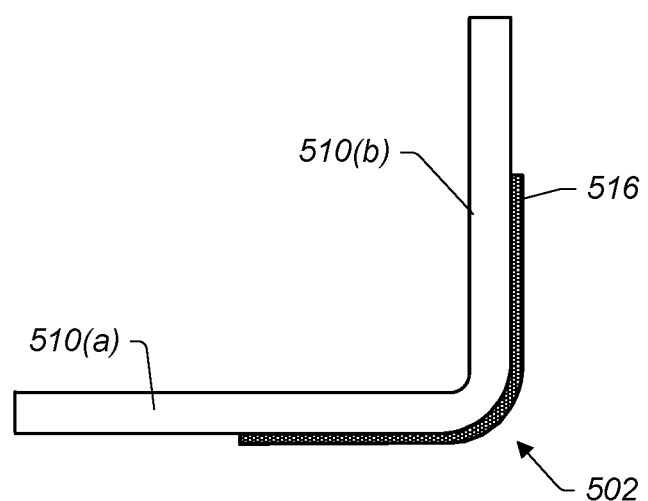
FIG. 6 illustrates a side view of an example reinforcement layer that may be used in a reinforcement arrangement for reinforcing one or more portions of a dynamic flex circuit in a camera with a moveable image sensor, in accordance with some embodiments.

In some embodiments, the reinforcement arrangement 502 may additionally, or alternatively, include one or more additional layers of material 516 attached to the dynamic flex circuit 500 at one or more bend regions. For example, as shown in FIGS. 5-6, an additional layer of material 516 (e.g., PI, aluminum, stainless steel, etc.) may be attached to the flex circuit material(s) at a bend region such that at least a portion of the bend region is thicker than one or more adjacent straight regions. As indicated above, the additional layer of material 516 may additionally, or alternatively, be used for retaining the bend shape of the dynamic flex circuit 500 at the bend region. In some embodiments, one or more of the additional layers of material 516 may be attached to the dynamic flex circuit 500 with adhesive. Additionally, or alternatively, one or more of the additional layers of material 516 may be provided on the flex circuit 500, and portion(s) of the additional layer(s) of material 516 may be etched away so as to only leave the additional layer(s) of material 516 at the bend region(s).

While the reinforcement arrangement 502 is illustrated with respect to certain bend regions in FIG. 5, it should be understood that various combinations of locally widening and/or thickening (e.g., by adding layer(s) of material) may be used with respect to one or more bend regions of the dynamic flex circuit 500.

In some embodiments, one or more of the straight regions 510(a)-510(d) may be designed with sufficient service loop to maintain low stress and strain at one or more of the bend regions. Furthermore, the bend radii of the bend regions may be designed to maintain low stress and strain at the bend regions. In some non-limiting examples, a bend radius of a bend region may be greater than or equal to three times the thickness of the dynamic flex circuit 500. In some non-limiting examples, the bend radius of a bend region may be greater than or equal to five times the thickness of the dynamic flex circuit 500.

Multifunction Device Examples

Embodiments of electronic devices, user interfaces for such devices, and associated processes for using such devices are described. In some embodiments, the device is a portable communications device, such as a mobile telephone, that also contains other functions, such as PDA and/or music player functions. Example embodiments of portable multifunction devices include, without limitation, the iPhone®, iPod Touch®, and iPad® devices from Apple Inc. of Cupertino, Calif. Other portable electronic devices, such as laptops, cameras, cell phones, or tablet computers, may also be used. It should also be understood that, in some embodiments, the device is not a portable communications device, but is a desktop computer with a camera. In some embodiments, the device is a gaming computer with orientation sensors (e.g., orientation sensors in a gaming controller). In other embodiments, the device is not a portable communications device, but is a camera.

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use at least one common physical user-interface device, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Figure 7:
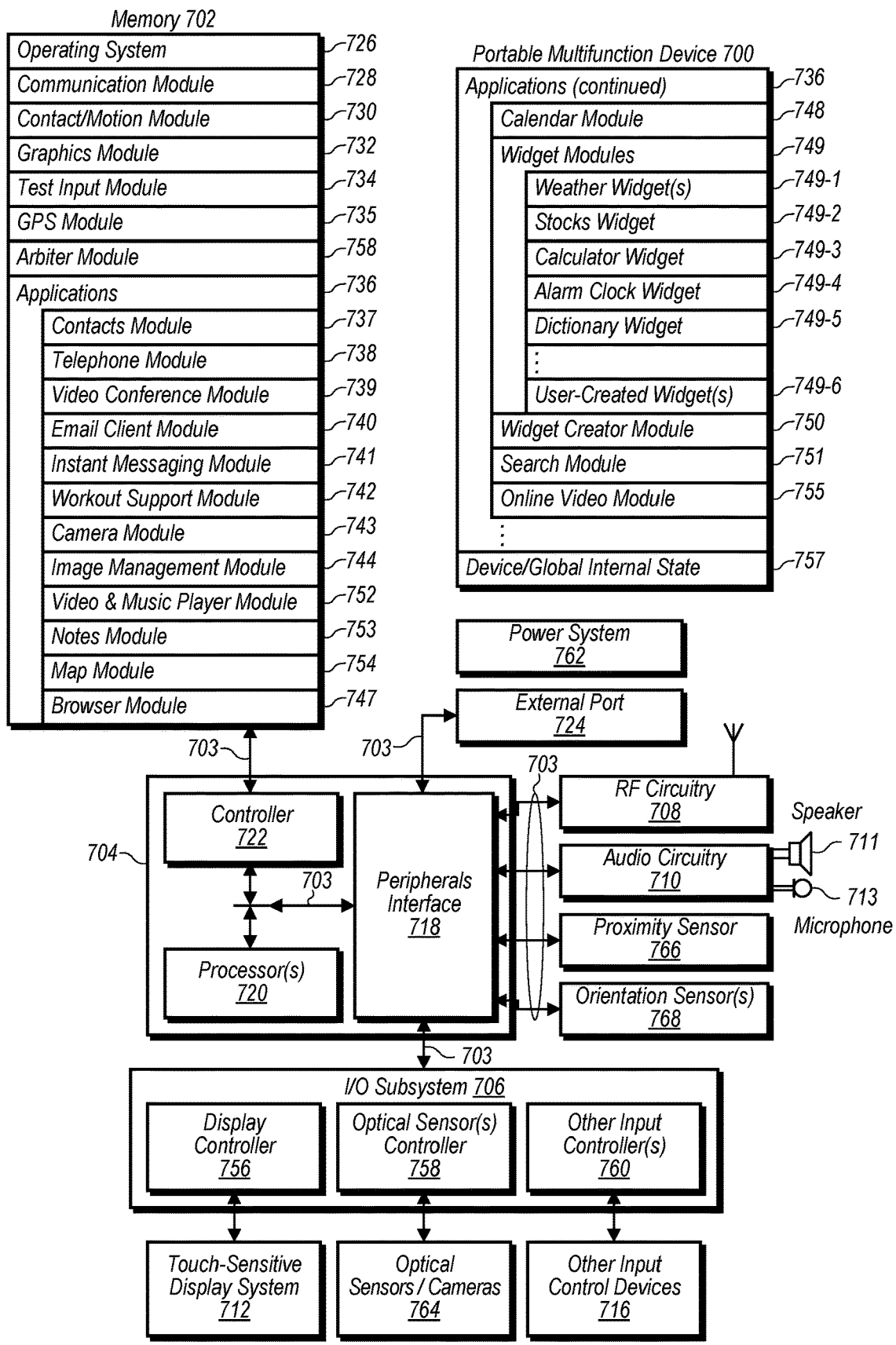
FIG. 7 illustrates a block diagram of a portable multifunction device that may include a dynamic flex circuit for a camera with a moveable image sensor, in accordance with some embodiments.

Attention is now directed toward embodiments of portable devices with cameras. FIG. 7 illustrates a block diagram of an example portable multifunction device 700 that may include a flex circuit for a camera with a moveable image sensor (e.g., as described above with reference to FIGS. 1-6), according to some embodiments. Cameras 764 are sometimes called "optical sensors" for convenience, and may also be known as or called an optical sensor system. Device 700 may include memory 702 (which may include one or more computer readable storage mediums), memory controller 722, one or more processing units (CPUs) 720, peripherals interface 718, RF circuitry 708, audio circuitry 710, speaker 711, touch-sensitive display system 712, microphone 713, input/output (I/O) subsystem 706, other input or control devices 716, and external port 724. Device 700 may include multiple optical sensors 764. These components may communicate over one or more communication buses or signal lines 703.

It should be appreciated that device 700 is only one example of a portable multifunction device, and that device 700 may have more or fewer components than shown, may combine two or more components, or may have a different configuration or arrangement of the components. The various components shown in FIG. 7 may be implemented in hardware, software, or a combination of hardware and software, including one or more signal processing and/or application specific integrated circuits.

Memory 702 may include high-speed random access memory and may also include non-volatile memory, such as one or more magnetic disk storage devices, flash memory devices, or other non-volatile solid-state memory devices. Access to memory 702 by other components of device 700, such as CPU 720 and the peripherals interface 718, may be controlled by memory controller 722.

Peripherals interface 718 can be used to couple input and output peripherals of the device to CPU 720 and memory 702. The one or more processors 720 run or execute various software programs and/or sets of instructions stored in memory 702 to perform various functions for device 700 and to process data.

In some embodiments, peripherals interface 718, CPU 720, and memory controller 722 may be implemented on a single chip, such as chip 704. In some other embodiments, they may be implemented on separate chips.

RF (radio frequency) circuitry 708 receives and sends RF signals, also called electromagnetic signals. RF circuitry 708 converts electrical signals to/from electromagnetic signals and communicates with communications networks and other communications devices via the electromagnetic signals. RF circuitry 708 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 708 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 710, speaker 711, and microphone 713 provide an audio interface between a user and device 700. Audio circuitry 710 receives audio data from peripherals interface 718, converts the audio data to an electrical signal, and transmits the electrical signal to speaker 711. Speaker 711 converts the electrical signal to human-audible sound waves. Audio circuitry 710 also receives electrical signals converted by microphone 713 from sound waves. Audio circuitry 710 converts the electrical signal to audio data and transmits the audio data to peripherals interface 718 for processing. Audio data may be retrieved from and/or transmitted to memory 702 and/or RF circuitry 708 by peripherals interface 718. In some embodiments, audio circuitry 710 also includes a headset jack (e.g., 812, FIG. 8). The headset jack provides an interface between audio circuitry 710 and removable audio input/output peripherals, such as output-only headphones or a headset with both output (e.g., a headphone for one or both ears) and input (e.g., a microphone).

I/O subsystem 706 couples input/output peripherals on device 700, such as touch screen 712 and other input control devices 716, to peripherals interface 718. I/O subsystem 706 may include display controller 756 and one or more input controllers 760 for other input or control devices. The one or more input controllers 760 receive/send electrical signals from/to other input or control devices 716. The other input control devices 716 may include physical buttons (e.g., push buttons, rocker buttons, etc.), dials, slider switches, joysticks, click wheels, and so forth. In some alternate embodiments, input controller(s) 760 may be coupled to any (or none) of the following: a keyboard, infrared port, USB port, and a pointer device such as a mouse. The one or more buttons (e.g., 808, FIG. 8) may include an up/down button for volume control of speaker 711 and/or microphone 713. The one or more buttons may include a push button (e.g., 806, FIG. 8).

Touch-sensitive display 712 provides an input interface and an output interface between the device and a user. Display controller 756 receives and/or sends electrical signals from/to touch screen 712. Touch screen 712 displays visual output to the user. The visual output may include graphics, text, icons, video, and any combination thereof (collectively termed "graphics"). In some embodiments, some or all of the visual output may correspond to user-interface objects.

Touch screen 712 has a touch-sensitive surface, sensor or set of sensors that accepts input from the user based on haptic and/or tactile contact. Touch screen 712 and display controller 756 (along with any associated modules and/or sets of instructions in memory 702) detect contact (and any movement or breaking of the contact) on touch screen 712 and converts the detected contact into interaction with user-interface objects (e.g., one or more soft keys, icons, web pages or images) that are displayed on touch screen 712. In an example embodiment, a point of contact between touch screen 712 and the user corresponds to a finger of the user.

Touch screen 712 may use LCD (liquid crystal display) technology, LPD (light emitting polymer display) technology, or LED (light emitting diode) technology, although other display technologies may be used in other embodiments. Touch screen 712 and display controller 756 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 712. In an example embodiment, projected mutual capacitance sensing technology is used, such as that found in the iPhone®, iPod Touch®, and iPad® from Apple Inc. of Cupertino, Calif.

Touch screen 712 may have a video resolution in excess of 800 dpi. In some embodiments, the touch screen has a video resolution of approximately 860 dpi. The user may make contact with touch screen 712 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 700 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 712 or an extension of the touch-sensitive surface formed by the touch screen.

Device 700 also includes power system 762 for powering the various components. Power system 762 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 700 may also include one or more optical sensors or cameras 764. FIG. 7 shows an optical sensor 764 coupled to optical sensor controller 758 in I/O subsystem 706. Optical sensor 764 may include charge-coupled device (CCD) or complementary metal-oxide semiconductor (CMOS) phototransistors. Optical sensor 764 receives light from the environment, projected through one or more lens, and converts the light to data representing an image. In conjunction with imaging module 743 (also called a camera module), optical sensor 764 may capture still images or video. In some embodiments, an optical sensor 764 is located on the back of device 700, opposite touch screen display 712 on the front of the device, so that the touch screen display 712 may be used as a viewfinder for still and/or video image acquisition. In some embodiments, another optical sensor is located on the front of the device so that the user's image may be obtained for videoconferencing while the user views the other video conference participants on the touch screen display.

Device 700 may also include one or more proximity sensors 766. FIG. 7 shows proximity sensor 766 coupled to peripherals interface 718. Alternately, proximity sensor 766 may be coupled to input controller 760 in I/O subsystem 706. In some embodiments, the proximity sensor 766 turns off and disables touch screen 712 when the multifunction device 700 is placed near the user's ear (e.g., when the user is making a phone call).

Device 700 includes one or more orientation sensors 768. In some embodiments, the one or more orientation sensors 768 include one or more accelerometers (e.g., one or more linear accelerometers and/or one or more rotational accelerometers). In some embodiments, the one or more orientation sensors 768 include one or more gyroscopes. In some embodiments, the one or more orientation sensors 768 include one or more magnetometers. In some embodiments, the one or more orientation sensors 768 include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 700. In some embodiments, the one or more orientation sensors 768 include any combination of orientation/rotation sensors. FIG. 7 shows the one or more orientation sensors 768 coupled to peripherals interface 718. Alternately, the one or more orientation sensors 768 may be coupled to an input controller 760 in I/O subsystem 706. In some embodiments, information is displayed on the touch screen display 712 in a portrait view or a landscape view based on an analysis of data received from the one or more orientation sensors 768.

In some embodiments, the software components stored in memory 702 include operating system 726, communication module (or set of instructions) 728, contact/motion module (or set of instructions) 730, graphics module (or set of instructions) 732, text input module (or set of instructions) 734, Global Positioning System (GPS) module (or set of instructions) 735, arbiter module 758 and applications (or sets of instructions) 736. Furthermore, in some embodiments memory 702 stores device/global internal state 757. Device/global internal state 757 includes one or more of: active application state, indicating which applications, if any, are currently active; display state, indicating what applications, views or other information occupy various regions of touch screen display 712; sensor state, including information obtained from the device's various sensors and input control devices 716; and location information concerning the device's location and/or attitude.

Operating system 726 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 728 facilitates communication with other devices over one or more external ports 724 and also includes various software components for handling data received by RF circuitry 708 and/or external port 724. External port 724 (e.g., Universal Serial Bus (USB), FIRE-WIRE, etc.) is adapted for coupling directly to other devices or indirectly over a network (e.g., the Internet, wireless LAN, etc.). In some embodiments, the external port is a multi-pin (e.g., 30-pin) connector.

Contact/motion module 730 may detect contact with touch screen 712 (in conjunction with display controller 756) and other touch sensitive devices (e.g., a touchpad or physical click wheel). Contact/motion module 730 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 730 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 730 and display controller 756 detect contact on a touchpad.

Contact/motion module 730 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 732 includes various known software components for rendering and displaying graphics on touch screen 712 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 732 stores data representing graphics to be used. Each graphic may be assigned a corresponding code. Graphics module 732 receives, from applications etc., one or more codes specifying graphics to be displayed along with, if necessary, coordinate data and other graphic property data, and then generates screen image data to output to display controller 756.

Text input module 734, which may be a component of graphics module 732, provides soft keyboards for entering text in various applications (e.g., contacts 737, e-mail 740, IM 741, browser 747, and any other application that needs text input).

GPS module 735 determines the location of the device and provides this information for use in various applications (e.g., to telephone 738 for use in location-based dialing, to camera 743 as picture/video metadata, and to applications that provide location-based services such as weather widgets, local yellow page widgets, and map/navigation widgets).

Applications 736 may include the following modules (or sets of instructions), or a subset or superset thereof:
- contacts module 737 (sometimes called an address book or contact list);
- telephone module 738;
- video conferencing module 739;
- e-mail client module 740;
- instant messaging (IM) module 741;
- workout support module 742;
- camera module 743 for still and/or video images;
- image management module 744;
- browser module 747;
- calendar module 748;
- widget modules 749, which may include one or more of: weather widget 749-1, stocks widget 749-2, calculator widget 749-3, alarm clock widget 749-4, dictionary widget 749-5, and other widgets obtained by the user, as well as user-created widgets 749-6;
- widget creator module 750 for making user-created widgets 749-6;
- search module 751;
- video and music player module 752, which may be made up of a video player module and a music player module;
- notes module 753;
- map module 754; and/or
- online video module 755.

Examples of other applications 736 that may be stored in memory 702 include other word processing applications, other image editing applications, drawing applications, presentation applications, JAVA-enabled applications, encryption, digital rights management, voice recognition, and voice replication.

In conjunction with touch screen 712, display controller 756, contact module 730, graphics module 732, and text input module 734, contacts module 737 may be used to manage an address book or contact list (e.g., stored in application internal state 757), including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone 738, video conference 739, e-mail 740, or IM 741; and so forth.

In conjunction with RF circuitry 708, audio circuitry 710, speaker 711, microphone 713, touch screen 712, display controller 756, contact module 730, graphics module 732, and text input module 734, telephone module 738 may be used to enter a sequence of characters corresponding to a telephone number, access one or more telephone numbers in address book 737, modify a telephone number that has been entered, dial a respective telephone number, conduct a conversation and disconnect or hang up when the conversation is completed. As noted above, the wireless communication may use any of a variety of communications standards, protocols and technologies.

In conjunction with RF circuitry 708, audio circuitry 710, speaker 711, microphone 713, touch screen 712, display controller 756, optical sensor 764, optical sensor controller 758, contact module 730, graphics module 732, text input module 734, contact list 737, and telephone module 738, videoconferencing module 739 includes executable instructions to initiate, conduct, and terminate a video conference between a user and one or more other participants in accordance with user instructions.

In conjunction with RF circuitry 708, touch screen 712, display controller 756, contact module 730, graphics module 732, and text input module 734, e-mail client module 740 includes executable instructions to create, send, receive, and manage e-mail in response to user instructions. In conjunction with image management module 744, e-mail client module 740 makes it very easy to create and send e-mails with still or video images taken with camera module 743.

In conjunction with RF circuitry 708, touch screen 712, display controller 756, contact module 730, graphics module 732, and text input module 734, the instant messaging module 741 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages and to view received instant messages. In some embodiments, transmitted and/or received instant messages may include graphics, photos, audio files, video files and/or other attachments as are supported in a MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 708, touch screen 712, display controller 756, contact module 730, graphics module 732, text input module 734, GPS module 735, map module 754, and music player module 746, workout support module 742 includes executable instructions to create workouts (e.g., with time, distance, and/or calorie burning goals); communicate with workout sensors (sports devices); receive workout sensor data; calibrate sensors used to monitor a workout; select and play music for a workout; and display, store and transmit workout data.

In conjunction with touch screen 712, display controller 756, optical sensor(s) 764, optical sensor controller 758, contact module 730, graphics module 732, and image management module 744, camera module 743 includes executable instructions to capture still images or video (including a video stream) and store them into memory 702, modify characteristics of a still image or video, or delete a still image or video from memory 702.

In conjunction with touch screen 712, display controller 756, contact module 730, graphics module 732, text input module 734, and camera module 743, image management module 744 includes executable instructions to arrange, modify (e.g., edit), or otherwise manipulate, label, delete, present (e.g., in a digital slide show or album), and store still and/or video images.

In conjunction with RF circuitry 708, touch screen 712, display system controller 756, contact module 730, graphics module 732, and text input module 734, browser module 747 includes executable instructions to browse the Internet in accordance with user instructions, including searching, linking to, receiving, and displaying web pages or portions thereof, as well as attachments and other files linked to web pages.

In conjunction with RF circuitry 708, touch screen 712, display system controller 756, contact module 730, graphics module 732, text input module 734, e-mail client module 740, and browser module 747, calendar module 748 includes executable instructions to create, display, modify, and store calendars and data associated with calendars (e.g., calendar entries, to do lists, etc.) in accordance with user instructions.

In conjunction with RF circuitry 708, touch screen 712, display system controller 756, contact module 730, graphics module 732, text input module 734, and browser module 747, widget modules 749 are mini-applications that may be downloaded and used by a user (e.g., weather widget 749-1, stocks widget 749-2, calculator widget 749-3, alarm clock widget 749-4, and dictionary widget 749-5) or created by the user (e.g., user-created widget 749-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 708, touch screen 712, display system controller 756, contact module 730, graphics module 732, text input module 734, and browser module 747, the widget creator module 750 may be used by a user to create widgets (e.g., turning a user-specified portion of a web page into a widget).

In conjunction with touch screen 712, display system controller 756, contact module 730, graphics module 732, and text input module 734, search module 751 includes executable instructions to search for text, music, sound, image, video, and/or other files in memory 702 that match one or more search criteria (e.g., one or more user-specified search terms) in accordance with user instructions.

In conjunction with touch screen 712, display system controller 756, contact module 730, graphics module 732, audio circuitry 710, speaker 711, RF circuitry 708, and browser module 747, video and music player module 752 includes executable instructions that allow the user to download and play back recorded music and other sound files stored in one or more file formats, such as MP3 or AAC files, and executable instructions to display, present or otherwise play back videos (e.g., on touch screen 712 or on an external, connected display via external port 724). In some embodiments, device 700 may include the functionality of an MP3 player.

In conjunction with touch screen 712, display controller 756, contact module 730, graphics module 732, and text input module 734, notes module 753 includes executable instructions to create and manage notes, to do lists, and the like in accordance with user instructions.

In conjunction with RF circuitry 708, touch screen 712, display system controller 756, contact module 730, graphics module 732, text input module 734, GPS module 735, and browser module 747, map module 754 may be used to receive, display, modify, and store maps and data associated with maps (e.g., driving directions; data on stores and other points of interest at or near a particular location; and other location-based data) in accordance with user instructions.

In conjunction with touch screen 712, display system controller 756, contact module 730, graphics module 732, audio circuitry 710, speaker 711, RF circuitry 708, text input module 734, e-mail client module 740, and browser module 747, online video module 755 includes instructions that allow the user to access, browse, receive (e.g., by streaming and/or download), play back (e.g., on the touch screen or on an external, connected display via external port 724), send an e-mail with a link to a particular online video, and otherwise manage online videos in one or more file formats, such as H.264. In some embodiments, instant messaging module 741, rather than e-mail client module 740, is used to send a link to a particular online video.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 702 may store a subset of the modules and data structures identified above. Furthermore, memory 702 may store additional modules and data structures not described above.

In some embodiments, device 700 is a device where operation of a predefined set of functions on the device is performed exclusively through a touch screen and/or a touchpad. By using a touch screen and/or a touchpad as the primary input control device for operation of device 700, the number of physical input control devices (such as push buttons, dials, and the like) on device 700 may be reduced.

The predefined set of functions that may be performed exclusively through a touch screen and/or a touchpad include navigation between user interfaces. In some embodiments, the touchpad, when touched by the user, navigates device 700 to a main, home, or root menu from any user interface that may be displayed on device 700. In such embodiments, the touchpad may be referred to as a "menu button." In some other embodiments, the menu button may be a physical push button or other physical input control device instead of a touchpad.

Figure 8:
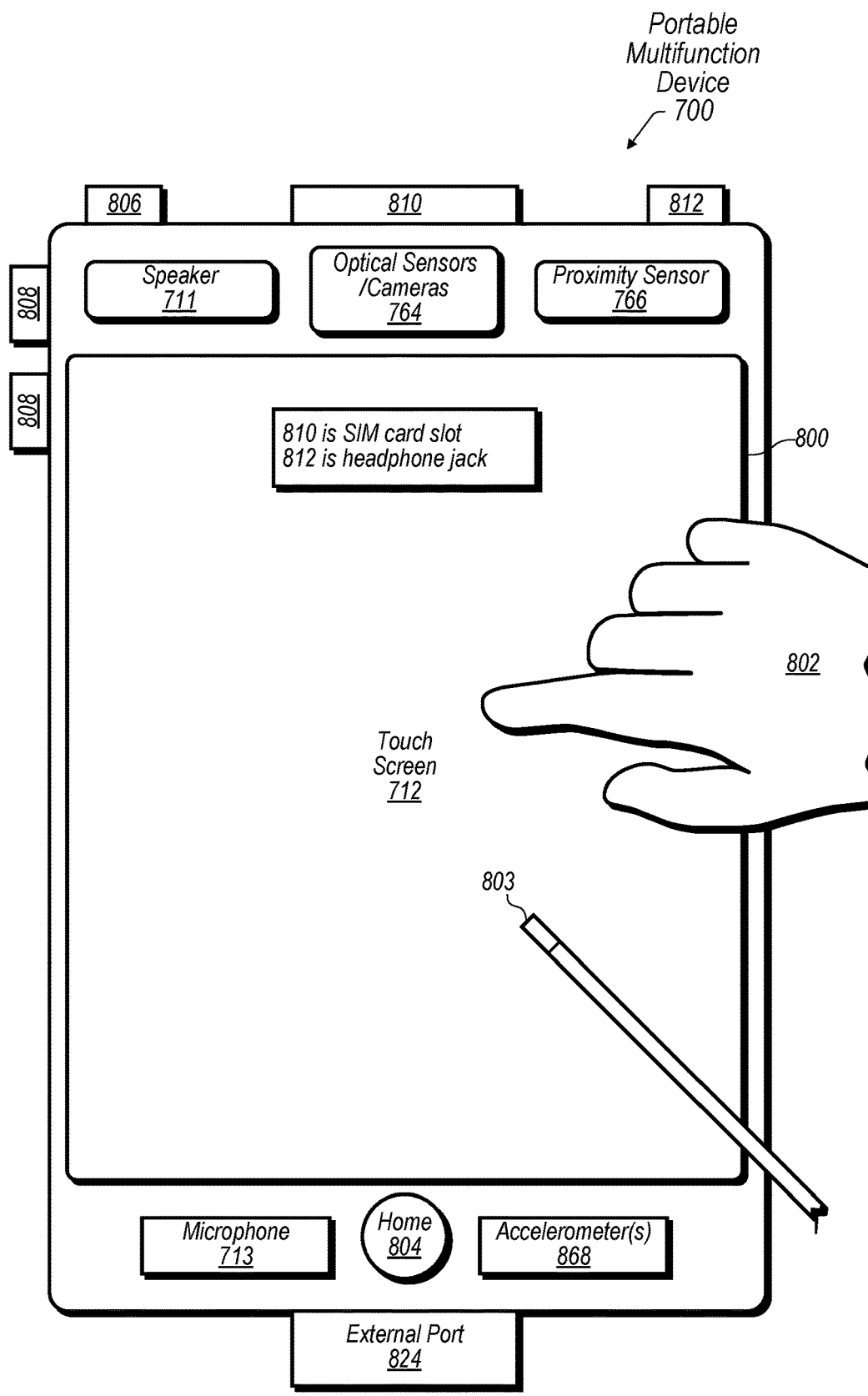
FIG. 8 illustrates a portable multifunction device that may include a dynamic flex circuit for a camera with a moveable image sensor, in accordance with some embodiments.

FIG. 8 depicts illustrates an example portable multifunction device 700 that may include a flex circuit for a camera with a moveable image sensor (e.g., as described above with reference to FIGS. 1-6), according to some embodiments. The device 700 may have a touch screen 712. The touch screen 712 may display one or more graphics within user interface (UI) 800. In this embodiment, as well as others described below, a user may select one or more of the graphics by making a gesture on the graphics, for example, with one or more fingers 802 (not drawn to scale in the figure) or one or more styluses 803 (not drawn to scale in the figure).

Device 700 may also include one or more physical buttons, such as "home" or menu button 804. As described previously, menu button 804 may be used to navigate to any application 736 in a set of applications that may be executed on device 700. Alternatively, in some embodiments, the menu button 804 is implemented as a soft key in a GUI displayed on touch screen 712.

In one embodiment, device 700 includes touch screen 712, menu button 804, push button 806 for powering the device on/off and locking the device, volume adjustment button(s) 808, Subscriber Identity Module (SIM) card slot 810, head set jack 812, and docking/charging external port 824. Push button 806 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 700 also may accept verbal input for activation or deactivation of some functions through microphone 713.

It should be noted that, although many of the examples herein are given with reference to optical sensor(s)/camera(s) 764 (on the front of a device), one or more rear-facing cameras or optical sensors that are pointed opposite from the display may be used instead of, or in addition to, an optical sensor(s)/camera(s) 764 on the front of a device.

Example Computer System

Figure 9:
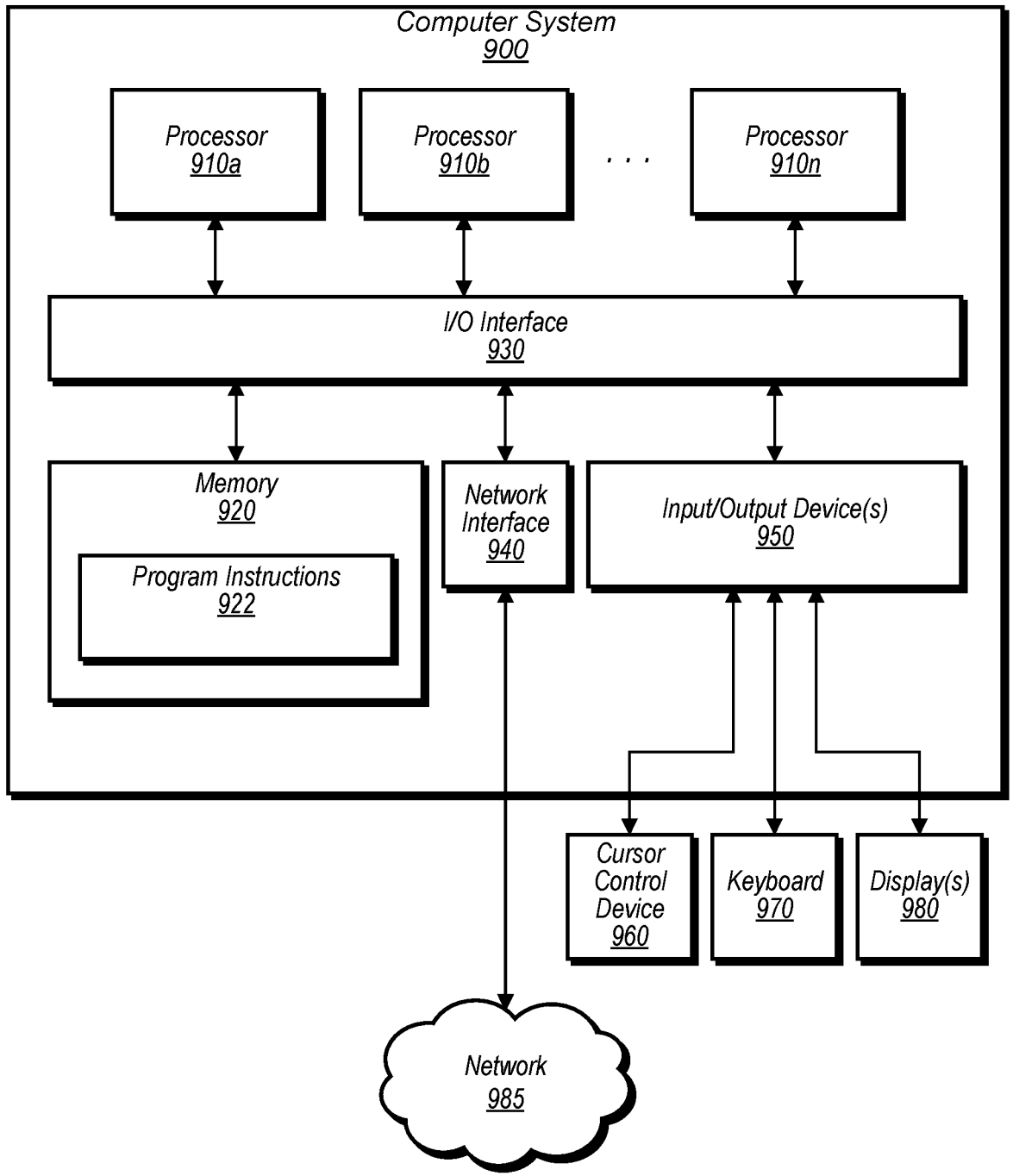
FIG. 9 illustrates an example computer system that may include a dynamic flex circuit for a camera with a moveable image sensor, in accordance with some embodiments.

FIG. 9 illustrates an example computer system 900 that may include a flex circuit for a camera with a moveable image sensor (e.g., as described above with reference to FIGS. 1-6), according to some embodiments. The computer system 900 may be configured to execute any or all of the embodiments described above. In different embodiments, computer system 900 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, including embodiments of magnetic position sensing, as described herein may be executed in one or more computer systems 900, which may interact with various other devices. Note that any component, action, or functionality described above with respect to FIGS. 1-8 may be implemented on one or more computers configured as computer system 900 of FIG. 9, according to various embodiments. In the illustrated embodiment, computer system 900 includes one or more processors 910 coupled to a system memory 920 via an input/output (I/O) interface 930. Computer system 900 further includes a network interface 940 coupled to I/O interface 930, and one or more input/output devices 950, such as cursor control device 960, keyboard 970, and display(s) 980. In some cases, it is contemplated that embodiments may be implemented using a single instance of computer system 900, while in other embodiments multiple such systems, or multiple nodes making up computer system 900, may be configured to host different portions or instances of embodiments. For example, in one embodiment some elements may be implemented via one or more nodes of computer system 900 that are distinct from those nodes implementing other elements.

In various embodiments, computer system 900 may be a uniprocessor system including one processor 910, or a multiprocessor system including several processors 910 (e.g., two, four, eight, or another suitable number). Processors 910 may be any suitable processor capable of executing instructions. For example, in various embodiments processors 910 may be general-purpose or embedded processors implementing any of a variety of instruction set architectures (ISAs), such as the x86, PowerPC, SPARC, or MIPS ISAs, or any other suitable ISA. In multiprocessor systems, each of processors 910 may commonly, but not necessarily, implement the same ISA.

System memory 920 may be configured to store camera control program instructions 922 and/or camera control data accessible by processor 910. In various embodiments, system memory 920 may be implemented using any suitable memory technology, such as static random access memory (SRAM), synchronous dynamic RAM (SDRAM), nonvolatile/Flash-type memory, or any other type of memory. In the illustrated embodiment, program instructions 922 may be configured to implement a lens control application 924 incorporating any of the functionality described above. Additionally, existing camera control data 932 of memory 920 may include any of the information or data structures described above. In some embodiments, program instructions and/or data may be received, sent or stored upon different types of computer-accessible media or on similar media separate from system memory 920 or computer system 900. While computer system 900 is described as implementing the functionality of functional blocks of previous Figures, any of the functionality described herein may be implemented via such a computer system.

In one embodiment, I/O interface 930 may be configured to coordinate I/O traffic between processor 910, system memory 920, and any peripheral devices in the device, including network interface 940 or other peripheral interfaces, such as input/output devices 950. In some embodiments, I/O interface 930 may perform any necessary protocol, timing or other data transformations to convert data signals from one component (e.g., system memory 920) into a format suitable for use by another component (e.g., processor 910). In some embodiments, I/O interface 930 may include support for devices attached through various types of peripheral buses, such as a variant of the Peripheral Component Interconnect (PCI) bus standard or the Universal Serial Bus (USB) standard, for example. In some embodiments, the function of I/O interface 930 may be split into two or more separate components, such as a north bridge and a south bridge, for example. Also, in some embodiments some or all of the functionality of I/O interface 930, such as an interface to system memory 920, may be incorporated directly into processor 910.

Network interface 940 may be configured to allow data to be exchanged between computer system 900 and other devices attached to a network 985 (e.g., carrier or agent devices) or between nodes of computer system 900. Network 985 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 940 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 950 may, in some embodiments, include one or more display terminals, keyboards, keypads, touchpads, scanning devices, voice or optical recognition devices, or any other devices suitable for entering or accessing data by one or more computer systems 900. Multiple input/output devices 950 may be present in computer system 900 or may be distributed on various nodes of computer system 900. In some embodiments, similar input/output devices may be separate from computer system 900 and may interact with one or more nodes of computer system 900 through a wired or wireless connection, such as over network interface 940.

As shown in FIG. 9, memory 920 may include program instructions 922, which may be processor-executable to implement any element or action described above. In one embodiment, the program instructions may implement the methods described above. In other embodiments, different elements and data may be included. Note that data may include any data or information described above.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 900 may be transmitted to computer system 900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations.

Additional descriptions of embodiments (example clauses):

Clause 1: A camera comprising: one or more optical elements; an image sensor to capture light that has passed through the one or more optical elements; an actuator to move the image sensor relative to the one or more optical elements; a stationary structure; and a flex circuit, comprising: a fixed end portion fixedly attached to the stationary structure; a moveable end portion coupled with the image sensor such that the moveable end portion moves with the image sensor relative to the fixed end portion; and an intermediate portion that extends from the fixed end portion to the moveable end portion and that allows the moveable end portion to move with the image sensor, wherein the intermediate portion comprises: straight regions; and one or more bend regions at which the flex circuit bends, wherein the one or more bend regions comprise a bend region that interconnects two of the straight regions with one another; wherein the camera is configured to convey electrical signals between the stationary structure and the image sensor via the flex circuit.

Clause 2: The camera of Clause 1, wherein: the bend region is a first bend region at which the flex circuit bends about a first axis; and the one or more bend regions further comprise: a second bend region at which the flex circuit bends about a second axis that intersects the first axis.

Clause 3: The camera of Clause 2, wherein: the straight regions comprise: a first straight region extending in a first direction; and a second straight region extending in a second direction different from the first direction; and the first bend region interconnects the first straight region with the second straight region.

Clause 4: The camera of Clause 3, wherein: the flex circuit comprises one or more flex circuit materials; and the camera further comprises: a reinforcement arrangement at the first bend region that reinforces the first bend region relative to each of the first straight region and the second straight region, the reinforcement arrangement comprising at least one of: a contiguous strip of at least one flex circuit material of the one or more flex circuit materials that is wider at the first bend region than respective contiguous strips of the at least one flex circuit material at the first straight region and the second straight region; or an additional layer of material attached to the one or more flex circuit materials at the bend region such that at least a portion of the bend region is thicker than each of the first straight region and the second straight region.

Clause 5: The camera of any of Clauses 1-4, wherein: the image sensor defines a plane; and the actuator is configured to move the image sensor in directions orthogonal to the plane and parallel to the plane.

Clause 6: The camera of any of Clauses 1-5, further comprising: a substrate attached to the image sensor; wherein: the moveable end portion of the flex circuit is attached to the substrate; and the substrate is configured to convey the electrical signals between the moveable end portion and the image sensor.

Clause 7: The camera of any of Clauses 1-6, wherein: the fixed end portion is a first fixed end portion positioned proximate a first side of the camera; the flex circuit further comprises a second fixed end portion positioned proximate a second side of the camera opposite the first side; and the first fixed end and the second fixed end provide electrical connections between the flex circuit and another flex circuit.

Clause 8: A device, comprising: one or more processors; memory storing program instructions executable by the one or more processors to control operation of a camera; and the camera, comprising: one or more optical elements; an image sensor to capture light that has passed through the one or more optical elements; an actuator to move the image sensor relative to the one or more optical elements; a stationary structure that is stationary relative to movement of the image sensor; and a flex circuit, comprising: a fixed end portion fixedly attached to the stationary structure; a moveable end portion coupled with the image sensor such that the moveable end portion moves with the image sensor relative to the fixed end portion; and an intermediate portion that allows the moveable end portion to move with the image sensor and that conveys electrical signals between the fixed end portion and the moveable end portion, wherein the intermediate portion comprises: straight regions; and one or more bend regions at which the flex circuit bends, wherein the one or more bend regions comprise a bend region that interconnects two of the straight regions with one another.

Clause 9: The device of Clause 8, wherein: the image sensor defines a plane; and the one or more processors are configured to cause the actuator to move the image sensor in directions orthogonal to the plane and parallel to the plane.

Clause 10: The device of any of Clauses 8 or 9, wherein: the bend region is a first bend region at which the flex circuit bends about a first axis; and the one or more bend regions further comprise: a second bend region at which the flex circuit bends about a second axis that intersects the first axis; and a third bend region at which the flex circuit bends about a third axis that is parallel to the first axis or the second axis.

Clause 11: The device of Clause 10, wherein: the straight regions comprise: a first straight region extending in a first direction; and a second straight region extending in a second direction different from the first direction; and the first bend region interconnects the first straight region with the second straight region.

Clause 12: The device of Clause 11, wherein: the flexible circuit comprises one or more flex circuit materials; and a contiguous strip of at least one flex circuit material of the one or more flex circuit materials at the first bend region is wider than respective contiguous strips of the at least one flex circuit material at the first straight region and the second straight region, so as to reinforce the bend region relative to each of the first straight region and the second straight region.

Clause 13: The device of any of Clauses 11 or 12, wherein: the flexible circuit comprises one or more flex circuit materials; and the camera further comprises: a reinforcement layer of material attached to the one or more flex circuit materials at the bend region such that at least a portion of the first region is thicker than at least one of the first straight region or the second straight region.

Clause 14: The device of any of Clauses 8-13, wherein the one or more optical elements comprise: an optical element to fold a path of the light before the light reaches the image sensor; wherein the image sensor is positioned between the optical element and the moveable end portion of the flex circuit.

Clause 15: The device of any of Clauses 8-14, wherein the camera further comprises: a suspension arrangement that suspends the image sensor from a base structure and that allows the image sensor to move relative to the base structure; wherein at least a portion of the flex circuit is spaced apart from the suspension arrangement.

Clause 16: A flex circuit for a camera, the flex circuit comprising: a fixed end portion to attach to a stationary structure of the camera; a moveable end portion to couple with a moveable image sensor of the camera, wherein an actuator of the camera is to move the moveable image sensor relative to one or more optical elements of the camera; and an intermediate portion to convey electrical signals between the fixed end portion and the moveable end portion, the intermediate portion comprising: a first straight region extending in a first direction; a second straight region extending in a second direction different from the first direction; and a bend region interconnecting the first straight region with the second straight region; wherein the intermediate portion is to allow the moveable end portion to move with the image sensor.

Clause 17: The flex circuit of Clause 16, wherein a portion of the first straight region splits into multiple legs that extend in parallel in the first direction.

Clause 18: The flex circuit of Clause 17, wherein: the first straight region comprises a wider portion extending between the moveable end portion and the multiple legs, the wider portion comprising a fan-out of electrical signal traces from the moveable end portion; and the electrical signal traces are routed to the fixed end portion via one or more of the multiple legs.

Clause 19: The flex circuit of any of Clauses 16-18, wherein: the fixed end portion is a first fixed end portion to attach proximate a first side of the camera; and the flex circuit further comprises: a second fixed end portion to attach proximate a second side of the camera, the second side opposite the first side.

Clause 20: The flex circuit of any of Clauses 16-19, wherein the intermediate portion extends along at least three planes that intersect with one another, each of the planes corresponding to a respective degree of freedom so as to allow the moveable end portion to move along at least three axes.

Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera, comprising:
one or more optical elements;
an image sensor to capture light that has passed through the one or more optical elements;
an actuator to move the image sensor relative to the one or more optical elements;
a stationary structure; and
a flex circuit, comprising:
 a fixed end portion fixedly attached to the stationary structure;
 a moveable end portion coupled with the image sensor such that the moveable end portion moves with the image sensor relative to the fixed end portion; and
 an intermediate portion that extends from the fixed end portion to the moveable end portion and that allows the moveable end portion to move with the image sensor, wherein the intermediate portion comprises:
 straight regions; and
 one or more bend regions at which the flex circuit bends, wherein the one or more bend regions comprise a bend region that interconnects two of the straight regions with one another;
wherein the camera is configured to convey electrical signals between the stationary structure and the image sensor via the flex circuit.

2. The camera of claim 1, wherein:
the bend region is a first bend region at which the flex circuit bends about a first axis; and
the one or more bend regions further comprise:
 a second bend region at which the flex circuit bends about a second axis that intersects the first axis.

3. The camera of claim 2, wherein:
the straight regions comprise:
 a first straight region extending in a first direction; and
 a second straight region extending in a second direction different from the first direction; and the first bend region interconnects the first straight region with the second straight region.

4. The camera of claim 3, wherein:
the flex circuit comprises one or more flex circuit materials; and
the camera further comprises:
 a reinforcement arrangement at the first bend region that reinforces the first bend region relative to each of the first straight region and the second straight region, the reinforcement arrangement comprising at least one of:
  a contiguous strip of at least one flex circuit material of the one or more flex circuit materials that is wider at the first bend region than respective contiguous strips of the at least one flex circuit material at the first straight region and the second straight region; or
  an additional layer of material attached to the one or more flex circuit materials at the bend region such that at least a portion of the bend region is thicker than each of the first straight region and the second straight region.

5. The camera of claim 1, wherein:
the image sensor defines a plane; and
the actuator is configured to move the image sensor in directions orthogonal to the plane and parallel to the plane.

6. The camera of claim 1, further comprising:
a substrate attached to the image sensor;
wherein:
 the moveable end portion of the flex circuit is attached to the substrate; and
 the substrate is configured to convey the electrical signals between the moveable end portion and the image sensor.

7. The camera of claim 1, wherein:
the fixed end portion is a first fixed end portion positioned proximate a first side of the camera;
the flex circuit further comprises a second fixed end portion positioned proximate a second side of the camera opposite the first side; and
the first fixed end and the second fixed end provide electrical connections between the flex circuit and another flex circuit.

8. A device, comprising:
one or more processors;
memory storing program instructions executable by the one or more processors to control operation of a camera; and
the camera, comprising:
 one or more optical elements;
 an image sensor to capture light that has passed through the one or more optical elements;
 an actuator to move the image sensor relative to the one or more optical elements;
 a stationary structure that is stationary relative to movement of the image sensor; and
 a flex circuit, comprising:
  a fixed end portion fixedly attached to the stationary structure;
  a moveable end portion coupled with the image sensor such that the moveable end portion moves with the image sensor relative to the fixed end portion; and
  an intermediate portion that allows the moveable end portion to move with the image sensor and that conveys electrical signals between the fixed end portion and the moveable end portion, wherein the intermediate portion comprises:
   straight regions; and
   one or more bend regions at which the flex circuit bends, wherein the one or more bend regions comprise a bend region that interconnects two of the straight regions with one another.

9. The device of claim 8, wherein:
the image sensor defines a plane; and
the one or more processors are configured to cause the actuator to move the image sensor in directions orthogonal to the plane and parallel to the plane.

10. The device of claim 8, wherein:
the bend region is a first bend region at which the flex circuit bends about a first axis; and
the one or more bend regions further comprise:
 a second bend region at which the flex circuit bends about a second axis that intersects the first axis; and
 a third bend region at which the flex circuit bends about a third axis that is parallel to the first axis or the second axis.

11. The device of claim 10, wherein:
the straight regions comprise:
 a first straight region extending in a first direction; and
 a second straight region extending in a second direction different from the first direction; and
the first bend region interconnects the first straight region with the second straight region.

12. The device of claim 11, wherein:
the flexible circuit comprises one or more flex circuit materials; and
a contiguous strip of at least one flex circuit material of the one or more flex circuit materials at the first bend region is wider than respective contiguous strips of the at least one flex circuit material at the first straight region and the second straight region, so as to reinforce the bend region relative to each of the first straight region and the second straight region.

13. The device of claim 11, wherein:
the flexible circuit comprises one or more flex circuit materials; and
the camera further comprises:
 a reinforcement layer of material attached to the one or more flex circuit materials at the bend region such that at least a portion of the first region is thicker than at least one of the first straight region or the second straight region.

14. The device of claim 8, wherein the one or more optical elements comprise:
an optical element to fold a path of the light before the light reaches the image sensor;
wherein the image sensor is positioned between the optical element and the moveable end portion of the flex circuit.

15. The device of claim 8, wherein the camera further comprises:
a suspension arrangement that suspends the image sensor from a base structure and that allows the image sensor to move relative to the base structure;
wherein at least a portion of the flex circuit is spaced apart from the suspension arrangement.

16. A flex circuit for a camera, the flex circuit comprising:
a fixed end portion to attach to a stationary structure of the camera;
a moveable end portion to couple with a moveable image sensor of the camera, wherein an actuator of the camera is to move the moveable image sensor relative to one or more optical elements of the camera; and an intermediate portion to convey electrical signals between the fixed end portion and the moveable end portion, the intermediate portion comprising:
- a first straight region extending in a first direction;
- a second straight region extending in a second direction different from the first direction; and
- a bend region interconnecting the first straight region with the second straight region;
- wherein the intermediate portion is to allow the moveable end portion to move with the image sensor.

17. The flex circuit of claim 16, wherein a portion of the first straight region splits into multiple legs that extend in parallel in the first direction.

18. The flex circuit of claim 17, wherein:
the first straight region comprises a wider portion extending between the moveable end portion and the multiple legs, the wider portion comprising a fan-out of electrical signal traces from the moveable end portion; and
the electrical signal traces are routed to the fixed end portion via one or more of the multiple legs.

19. The flex circuit of claim 16, wherein:
the fixed end portion is a first fixed end portion to attach proximate a first side of the camera; and
the flex circuit further comprises:
a second fixed end portion to attach proximate a second side of the camera, the second side opposite the first side.

20. The flex circuit of claim 16, wherein the intermediate portion extends along at least three planes that intersect with one another, each of the planes corresponding to a respective degree of freedom so as to allow the moveable end portion to move along at least three axes.

* * * * *